United States Patent [19]

Bright et al.

[11] Patent Number: 4,988,310

[45] Date of Patent: Jan. 29, 1991

[54] ZIF PGA SOCKET AND A TOOL FOR USE THEREWITH

[75] Inventors: Edward J. Bright, Middletown; James A. Hogan, Jr., Harriburg, both of Pa.

[73] Assignee: AMP Incorporated, Harrisburg, Pa.

[21] Appl. No.: 419,365

[22] Filed: Oct. 10, 1989

[51] Int. Cl.$^5$ .............................................. H01R 4/52
[52] U.S. Cl. ..................................... 439/342; 439/259
[58] Field of Search ............................. 439/259–263, 439/267, 347, 341, 342, 343, 137

[56] References Cited

U.S. PATENT DOCUMENTS

| | | | |
|---|---|---|---|
| 4,420,205 | 12/1983 | Kirkman | 439/266 |
| 4,498,725 | 2/1985 | Bright et al. | 439/347 |
| 4,542,946 | 9/1985 | Snow | 439/137 |
| 4,674,811 | 6/1987 | Corwin | 439/259 X |
| 4,750,891 | 6/1988 | Egawa | 439/259 |

*Primary Examiner*—Neil Abrams
*Assistant Examiner*—Khiem Nguyen

*Attorney, Agent, or Firm*—Allan B. Osborne

[57] ABSTRACT

A PGA socket (40) and a tool (132) for opening and closing the socket (40) is disclosed. The socket (40) includes a base housing (42) having contact elements (46) disposed in cavities (48). The contact elements (46) include laterally extending cantilever beams (90) which are bent out of the plane of the contact elements (40) to provide a force-free insertion of the leads (120) on the PGA (122). The socket (40) further includes a cover (44) slidably mounted on the housing (42) which when moved, drives the leads (120) into electrical engagement with the cantilever beams (90). The tool (132) includes a pair of spaced-apart jaws (154,516) with one (154) being fixed and the other (156) moveable towards the fixed jaw (154). The tool (132) is placed over the socket (40) with the jaws (154,156) on respective sides of the cover (44) so that as the one jaw (156) moves toward the other (154), it (156) pushes the cover (44) which moves the leads (120) either into or out of electrical engagement with the cantilever beams (90).

6 Claims, 7 Drawing Sheets

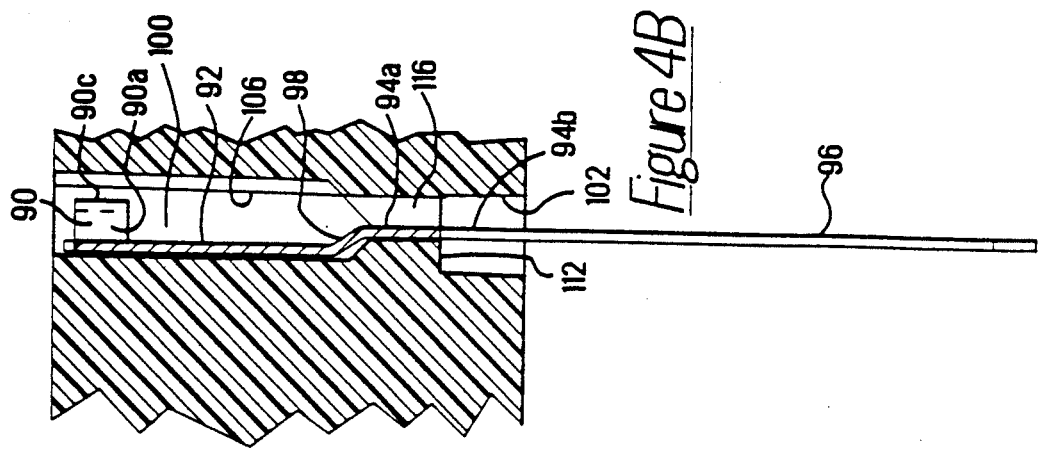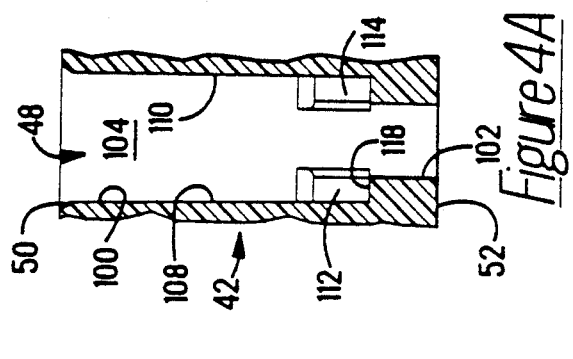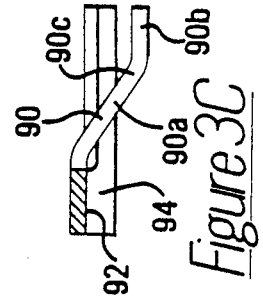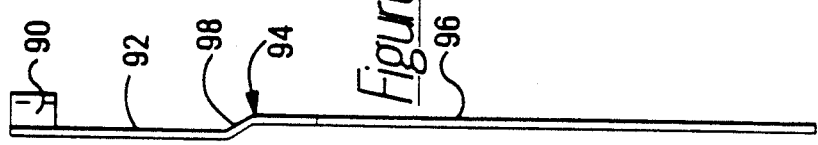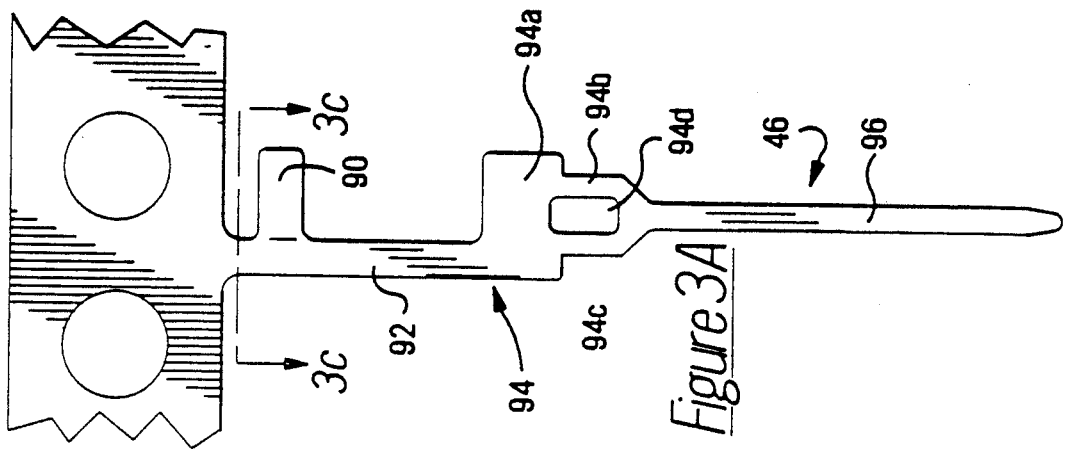

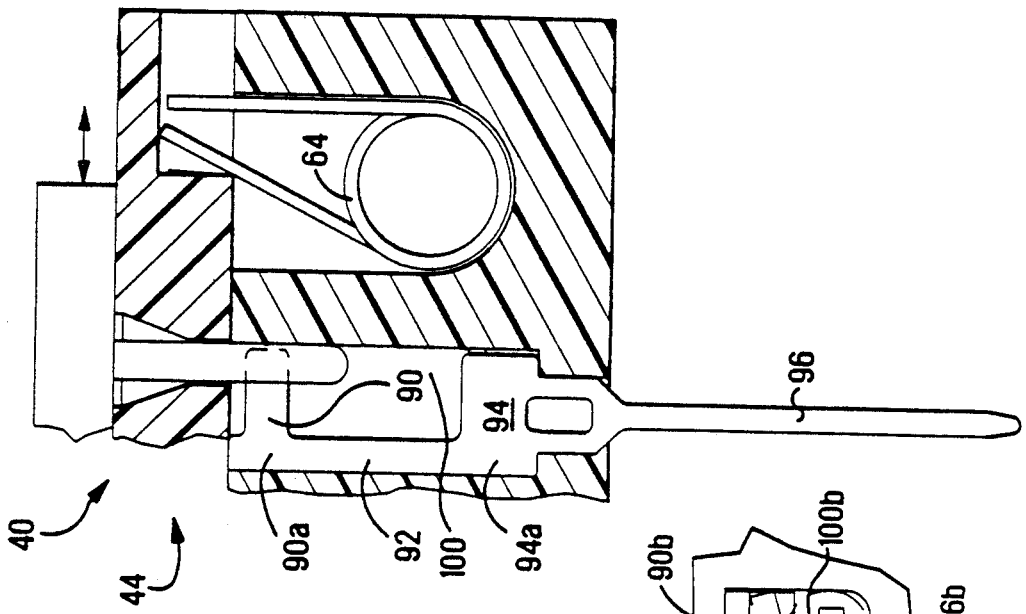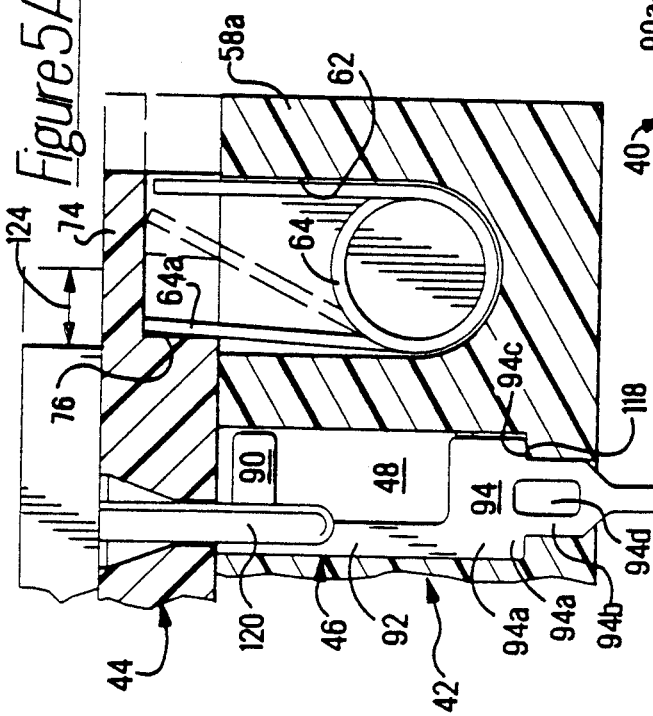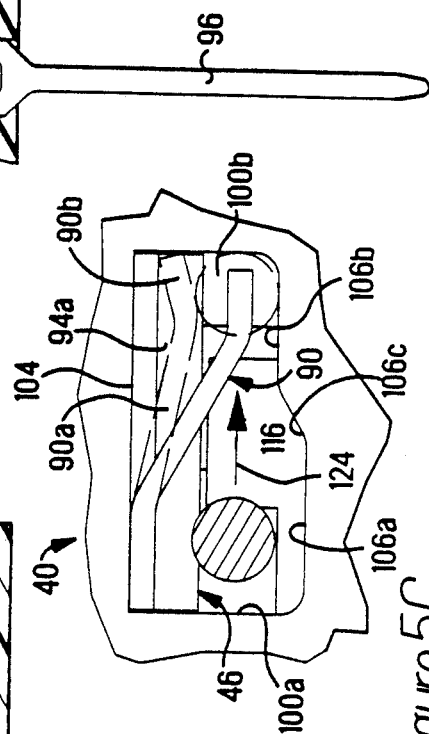

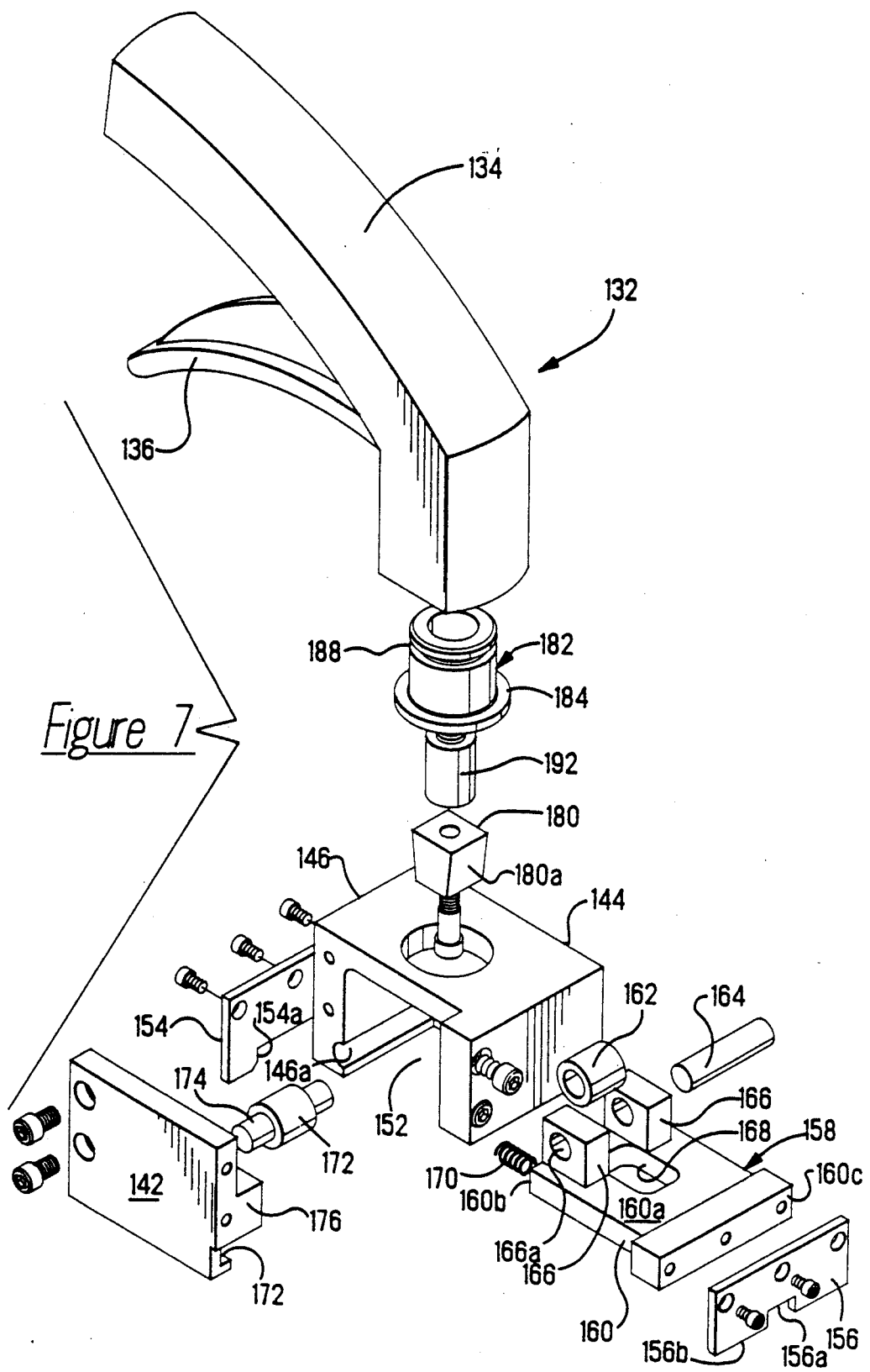

ZIF PGA SOCKET AND A TOOL FOR USE THEREWITH

FIELD OF THE INVENTION

The invention disclosed herein relates to electrical sockets for electronic packages known as pin grid arrays (PGA) and to a tool for opening and closing the socket.

BACKGROUND OF THE INVENTION

PGA sockets are known from U.S. Pat. No. 4,498,725 for example and are made and sold by manufactures such as AMP Incorporated of Harrisburg, Pa. These known sockets have levers that are used to open and close the contact elements therein for force-free insertion and removal and to electrically connect the PGAs to circuits on a printed circuit board (PCB) on which the sockets are mounted. While such mechanisms are very well suited and acceptable for most uses in the industry, they do take up space on the PCB and further, the sockets must be spaced apart to permit operation of the levers. Accordingly it is now proposed to provide a socket without such opening-closing mechanism and instead to provide a separate tool for doing that work.

SUMMARY OF THE INVENTION

According to the invention an electrical socket for electronic packages is provided which includes a base housing having a top surface and a plurality of elongated cavities, a plurality of contact elements having elongated cantilever beams disposed in respective elongated cavities and a cover slidably mounted on said top surface and having a plurality of openings therethough in registration with the cavities to admit leads from the electronic package into the cavities and upon sliding the cover, the leads are pushed into electrical engagement with the cantilever beams.

BRIEF DESCRIPTION OF THE DRAWINGS

FIG. 3A is a side view of a contact element of the socket on a carrier strip;

FIG. 3B is an edge view of the contact element;

FIG. 3C is a top plan view taken along line 3C—3C in FIG. 3A;

FIG. 4A is a side view of an element-receiving cavity in the socket;

FIG. 4B is an edge view of the cavity with an element in place;

FIGS. 5A and 5B are side views of an element-loaded cavity with a lead from a PGA initially inserted and in electrical engagement respectively;

FIG. 5C is a top plan view showing the movement of the PGA lead as shown in FIGS. 5A and 5B;

FIG. 7 is a perspective view of the tool with the operating head exploded; and

DESCRIPTION OF THE PRIOR ART

Figure 1:
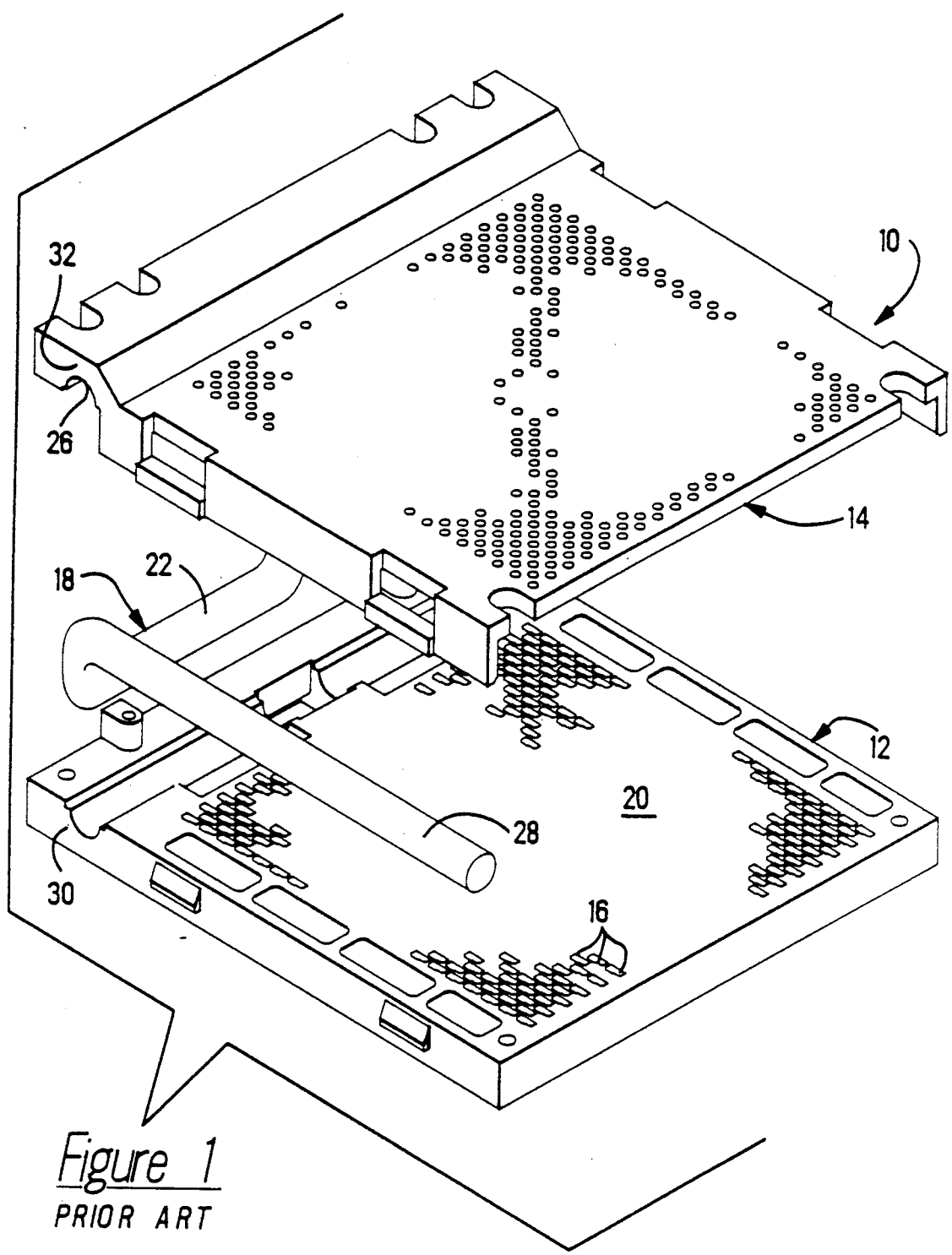
FIG. 1 is an exploded, perspective view of a prior art socket.

The prior art PGA socket 10 shown in FIG. 1 includes base housing 12, movable cover 14 and contact elements (not shown) positioned in cavities 16 in housing 12. Further included is L-shaped lever 18 which moves cover 14 across the top surface 20 of housing 12. Lever 18 includes a first arm 22 which is rotatably received in a passage in socket 10 defined by groove 24 in housing 12 and groove 26 in cover 14. Lever 18 also includes a second arm 28 which lies outside of socket 10 and provides a handle for rotating first arm 22 to move cover 14. Cover 14 is normally open so that the leads (not shown) on a PGA (not shown) may be inserted into cavities 16 freely. When lever 18 is rotated in one direction, cover 14 moves and pushes the leads into electrical engagement with the contact elements in cavities 16. By rotating lever 18 in the reverse direction, cover 14 moves back, pushing the lead out of electrical engagement.

As can be seen in FIG. 1, extension portions 30,32 at the ends of housing 12 and cover 14 respectively are required to provide structural support for grooves 24,26. Obviously, portions 30,32 increase the length of socket 10. Additionally, since second arm 28 of lever 18 extends outwardly from socket 10, it too makes socket 10 larger; i.e., socket 10 requires additional circuit board or backpanel real estate to accommodate the means to open and close it. Further, it is obvious that space between adjacent sockets 10 on a backpanel must be provided to permit access to operate lever 18.

DESCRIPTION OF THE INVENTION

Figure 2:
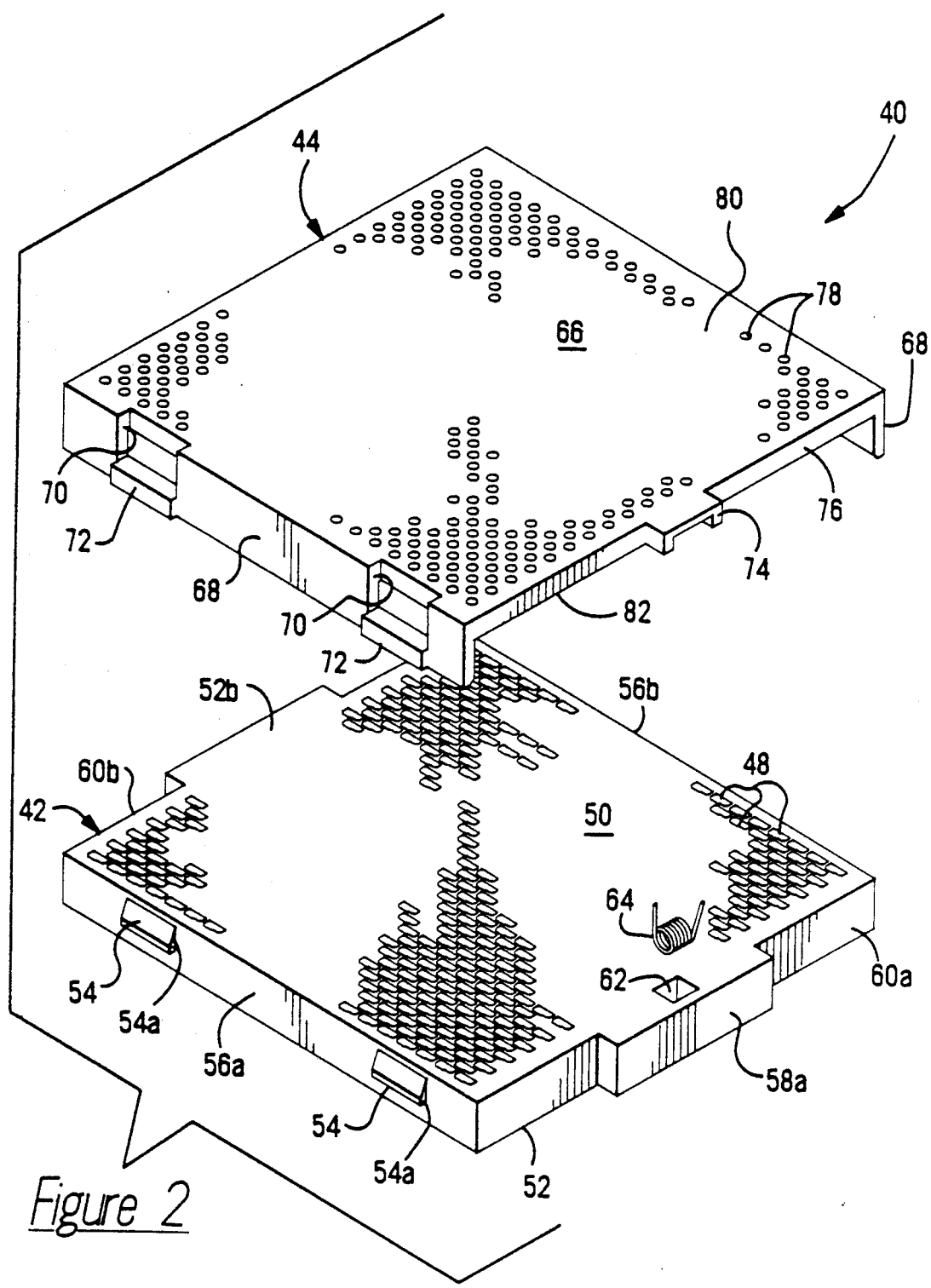
FIG. 2 is an exploded, perspective view of a socket according to the present invention.

Socket 40 of the present invention, shown in FIG. 2, includes base housing 42, cover 44 and contact elements 46 (FIGS. 3A–3C). A plurality of cavities 48 extend through housing 42, opening onto top surface 50 and under surface 52. Ears 54, provided on housing sides 56a,56b, include downwardly facing shoulders 54a. Laterally projecting platforms 58a,58b are provided on opposite housing sides 60a,60b respectively and are level with and a continuation of top surface 50 particularly. Aperture 62 extends into platform 58a from top surface 50 and receives therein spring 64.

Cover 44 includes plate 66 and a pair of skirts 68 depending from opposite sides Each skirt 68 is provided with openings 70 and cross bars 72. A downwardly opened U-shaped shroud 74 projects laterally outwardly from cover side 76. A plurality of openings 78 extend through plate 66, opening onto top surface 80 and under surface 82. Openings 78 are on the same pattern as cavities 48 in base housing 42.

More specific details of cavities 48 and openings 78 are noted below.

Contact elements 46 are shown in FIGS. 3A through 5C. Each element 46 includes a cantilever beam 90 which extends laterally from one end of an intermediate section 92. Retention section 94 is attached to an opposite end of intermediate section 92 and post 96 is attached to the lower end of retention section 94 As seen in FIGS. 3C and 5C, cantilever beam 90 includes a first portion 90a which is at an oblique angle relative to the plane of intermediate section 92. Preferably the angle is about thirty five degrees. A free end portion 90b is attached to first portion 90a by bend portion 90c which positions free end portion 90b parallel to the plane of intermediate section 92.

Retention section 94 and post 96 are offset relative to intermediate section 92 by strap 98 positioned between intermediate section 92 and retention section 94. Strap 98 is bent at each attachment point and is at about a forty five degree angle relative to the axis of element 46.

Retention section 94 includes plate like first portion 94a which is about as long as cantilever beam 90 and a second portion 94b of a reduced length and located between first portion 94a and post 96. The change in length defines downwardly facing shoulders 94c. Hole 94d is provided in second portion 94b to make it compliant.

Post 96 as illustrated is designed to be received in a hole in a PCB (not shown). Other type means (not shown) may be incorporated on elements 46 to provide electrical engagement with the conductive traces on a PCB.

As shown in FIG. 3A, contact elements 46 are preferably stamped and formed on strip and from a suitable conductive material such as beryllium cooper.

Cavity 48 of housing 42 is shown in a side cross section in FIG. 4A and in an end cross section in FIG. 4B. Cavity 48 includes upper section 100 and lower passage 102. Defining upper section 100 are side walls 104,106, end walls 108,110, side wall bosses 112,114 and 116. Side wall 104 is flat but opposite side wall 106 includes a first portion 106a attached to end wall 108, a second portion 106b attached to opposite end wall 110 and oblique portion 106c which offsets the first and second portions 106a,106b respectively into spaced apart but parallel planes. This structure provides a wide half-section 100a and narrow half-section 100b.

Bosses 112,114 project out from side wall 104 just above lower passage 102. Boss 116 projects out from opposite side wall 106 as shown in FIG. 4B. Bosses 112,114 and 116 reduce the width of cavity 48 to only very slightly greater than the thickness of retention section 94 on elements 46.

Lower passage 102 communicates with upper section 100 and opens onto under surface 52. Passage 102 has a smaller length than section 100 which defines upwardly facing ledges or floor segments 118 for section 100. The length of passage 102 is approximately equal to or very slightly less than the width of second portion 94b.

FIGS. 4B and 5A through 5C show a contact element 46 positioned in a cavity 48. Cantilever beam 90 is located just below top surface 50 of housing 42. The first portion 94a of retention section 94 is located between bosses 112,114,116 and rests on floor segments 118 which are next to end walls 108,110. The compliant second portion 94b is frictionally located in lower passage 102 and post 96 extends outwardly from housing 42. As illustrated in FIG. 5C, cantilever beam 90 extends into the narrow half-section 100b of upper section 100.

After contact elements 46 have been placed into cavities 48, cover 44 is placed over housing 42 and slidingly secured thereto by ears 54 projecting through openings 70 and shoulders 54a bearing on top of tie bars 72. Shroud 74 projects over aperture 62 and spring 64 therein. As shown in FIG. 5A, spring 64 is oriented so that biasing arm 64a thereon bears against cover side wall 76 and biases cover 44 to a predetermined location over housing 42; i.e., openings 78 in plate 66 are directly in line with wide half-sections 100a of cavities 48.

FIGS. 5A, 5B and 5C illustrate the insertion and termination of lead 120 on PGA package 122 as shown in FIG. 5A, lead 120 entered cavity 48 in the wide half-section 100a without interference from contact element 46; i.e., zero insertion force or "ZIF". Cover 44 is then moved across top surface 50 of housing 42 as indicated by arrow 124 in FIGS. 5A and 5C and carries or pushes lead 120 into engagement with cantilever beam 90. Lead 120 initially engages first portion 90a and as it travels therealong, causes beam 90 to resiliently deflect toward cavity side wall 104. FIGS. 5B,5C shows the final position of lead 120 (in phantom in FIG. 5C) in narrow half-section 100b and against free end portion 90b of beam 90. The deflected beam 90 exerts a force against lead 120 to maintain a good physical and electrical contact therewith. Further, as beam 90 is being deflected, intermediate section 92 is being resiliently twisted longitudinally to add a torsional force to the beam's compressive force so as to further enhance the contact.

The forces exerted on all the leads 120 by all the beams 90 is much greater than the biasing force being exerted by spring 64 and accordingly cover 44 cannot be moved back to disengage leads 120 without assistance from an outside agency. One such agency is tool 132 shown in FIGS. 6 through 8.

Figures 6A, 6B:
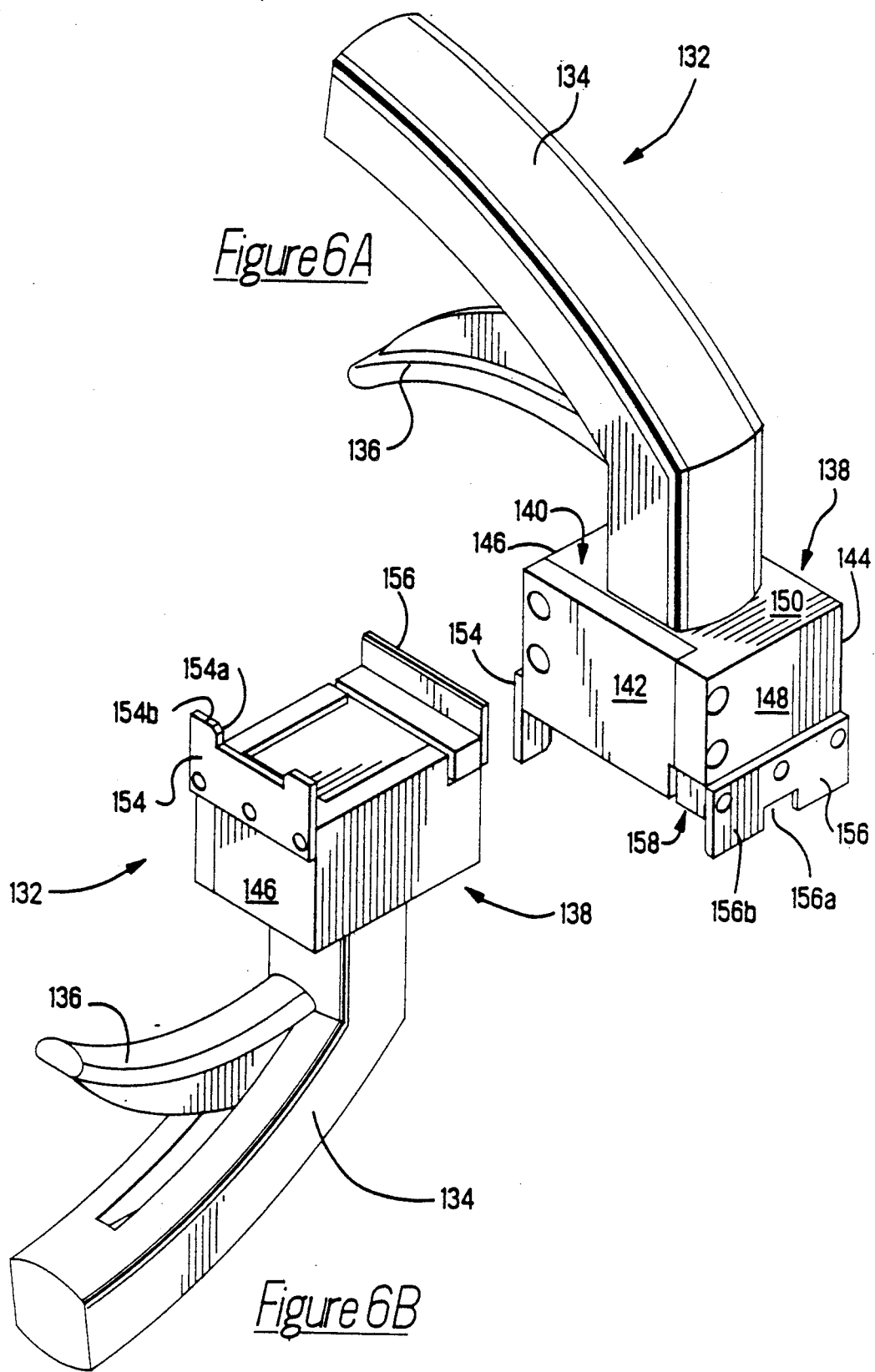
FIGS. 6A and 6B are perspective views of a tool according to the present invention used to open and close the socket.

As seen in FIGS. 6A and 6B, tool 132 includes handle 134, actuator 136 and operating head 138.

Figure 8:
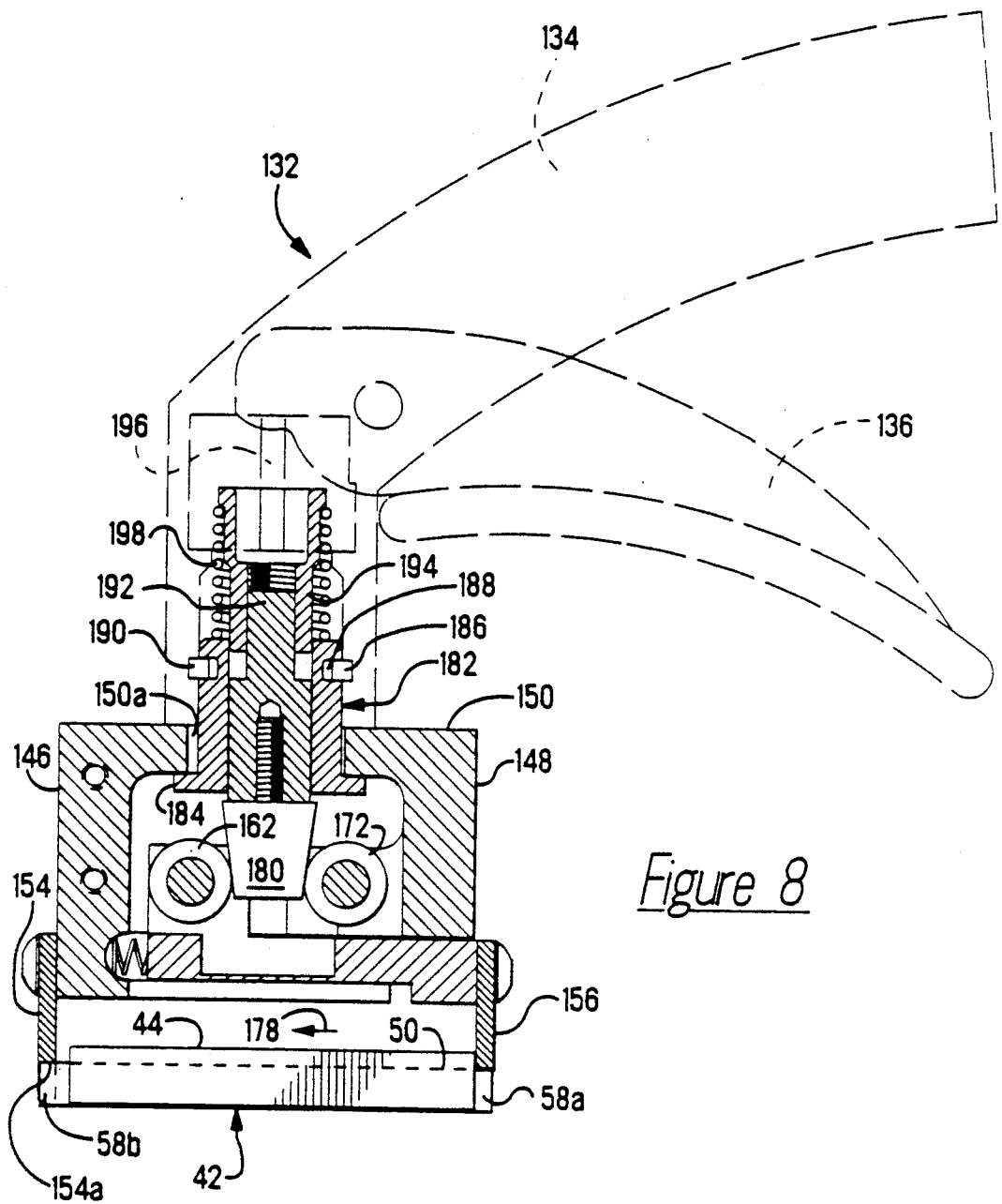
FIG. 8 is a side cross-sectional view of the operating head of the tool.

Head 138 includes housing 140 and the components therein and in handle 134 as shown in FIGS. 7 and 8. Housing 140 is defined by side walls 142,144, end walls 146,148 and top wall 150. Side wall 142 is removable to provide access to housing cavity 152 (FIG. 7). Fixed jaw 154 extends outwardly from and is secured to end wall 146 and is provided with notch 154a in free edge 154b. Moving jaw 156 is secured to sliding member 158 and extends outwardly from opposite end wall 148. Notch 156a is provided in free edge 156b of jaw 156.

As shown in FIGS. 7 and 8, sliding member 158 also includes plate 160 and roller 162 mounted on pin 164. Pin 164 is supported in holes 166a in journal blocks 166 which extend from surface 160a of plate 160. An aperture 168 is provided in surface 160a and small apertures (not shown) are provided in plate end 160b to receive coil springs 170. Jaw 156 is attached to opposite plate end 160c. When assembled in housing cavity 152, sliding member 158 is supported by inwardly projecting lips 172 on side walls 142,144 (not shown on side wall 144) and biased outwardly by coil springs 170 abutting the inside surface of end wall 146. Groove 146a is provided to receive the free ends of springs 170 to provide clearance for plate 160 as it is moved in that direction.

In addition to sliding member 158, a second roller 172 is contained in housing cavity 152. Roller 172 is carried on pin 174 which is journaled in apertures (not shown) in blocks 176 located on the inside surfaces of side walls 142 and 144 (not shown on side wall 144). As shown in FIG. 8, roller 162 is adjacent to end wall 146 and roller 172 is adjacent to opposite end wall 148.

Sliding member 158 and its attached jaw 156 is moved in the direction indicated by arrow 178 in FIG. 8, by wedge 180 being pushed down between rollers 162,172. The beveled sides 180a of wedge 180, in cooperation with stationary roller 172, pushes on roller 162 and causes the above noted movement of member 158. Coil springs 170 return sliding member 158 to its initial position when wedge 180 is removed from between rollers 162,172. Aperture 168 receives the free end of wedge 180 as it moves down between rollers 162,172.

Any number of driving mechanisms can be used to drive wedge 180. That shown in FIGS. 7 and 8 include an adaptor 182 which provides the attachment between housing 140 and handle 134; i.e., the cylindrical shaped adapter 182, which extends through hole 150a in top wall 150, includes a flange 184 on one end which engages the inside surface of top wall 150 and a circlip 186 in groove 188 at another end which projects into groove 190 in handle 134. Wedge 180 is attached to plunger 192 which is threaded into rod adjustor 194. As shown in FIG. 8, cam adjustment nut 196 is actuated by the cam on actuator 136. Coil spring 198 works to return wedge 180 to its initial position after actuator 136 is released. If desired, a ratchet mechanism (not shown) may be included to require actuator 136 be pulled back completely before it can be released.

In use, a PGA Package 122 is placed on top of socket 40 with the leads 120 thereon entering respective cavities 48 through openings 78 in cover 44 (FIG. 5A). Tool 132 is placed over the top of PGA Package 122 and socket 40 with jaws 154,156 resting on respective platforms 58 on opposite sides of socket housing 42 as shown in FIG. 8. In this respect, platform 58b centers tool 132 by sliding into notch 154a in jaw 154 and shroud 74 sliding into 156a in jaw 156. Upon driving wedge 180 in between rollers 162,172, sliding member 158 and its attached jaw 156 moves towards fixed jaw 154 as indicated by arrow 178, and thereby moves cover 44. As noted above, this drives leads 120 into engagement with cantilever beams 90 so as to make electrical contact therewith. Socket 40 is opened by placing tool 132 thereon in an opposite orientation to drive cover 44 back.

As can be discerned, a PGA socket and tool for operating it has been disclosed. The socket includes a base housing having contact elements disposed in isolated cavities with each contact element having a laterally extending cantilever beam. A cover is slidably mounted on the housing and has openings in alignment with each cavity. Leads extending outwardly from a PGA are inserted into the cavities through the cover openings and then driven into electrical engagement with the cantilever beams by sliding the cover across the housing surface. The tool includes a pair of spaced apart jaws, one of which is fixed and the other movable toward the fixed jaw. The tool is placed over the socket with the jaws on opposite sides of the cover so that as the movable jaw moves towards the other, it moves the cover to drive the PGA leads either into or out of electrical engagement with the cantilever beams on the contact elements.

I claim:

1. An electrical socket for electrically connecting an electronic package having depending leads to a back plane, said socket comprising:
    a base housing of insulating material and having a top surface, elongate cavities opening onto said top surface and an under surface, said elongated cavities having a wide end and a narrow end;
    conductive contact elements disposed in respective cavities, said contact elements having an intermediate section located in the wide end and a cantilever beam which extends into said narrow end of said cavity from an attachment to said intermediate section, said contact elements further having means thereon extending outwardly from said under surface for electrically engaging circuits on the back plane;
    a cover having openings therethrough, said cover slidably mounted on said top surface with said openings being in alignment with respective said cavities; and
    a coil spring disposed in said base housing and having arm means extending outwardly therefrom for engaging and for removably biasing said cover so that said openings are in alignment with said wide end of respective said cavities sot hat leads from the electronic package may be inserted into said cavities through said openings without engaging said contact elements therein.

2. The electrical socket of claim 1 wherein said cantilever beam includes a first portion which extends from said intermediate section at an angle oblique to the plane thereof and a free end portion which extends from said first portion on a plane parallel to and spaced from the plane of said intermediate section.

3. The electrical socket of claim 2 wherein said free end portion of said cantilever beam may be resiliently deflected towards the plane of said intermediate section by a lead on the electronic package being moved into said narrow end of said cavity.

4. The electrical socket of claim 3 wherein said intermediate section is adapted to twist as said cantilever beam is deflected.

5. An electrical socket for receiving leads extending outwardly from an electronic package, comprising:
    a dielectric base housing having a top surface and a plurality of elongated cavities opening into said top surface, said cavities having first and second oppositing sidewalls;
    a cover adapted to rest on and be moved across said top surface and having a plurality of openings therethrough which are in registration with at least a part of respective said elongated cavities; and
    a plurality of conductive contact elements disposed in said cavities and having a retention section and intermediate section which extend from a lower part of respective cavities towards said openings, and a cantilever beam which extends from said intermediate section along the length of respective cavities adjacent said openings, said cantilever beam having a free end portion which is parallel to at least one cavity sidewall and a first portion intermediate said intermediate section and said free end portion and which is at an oblique angle relative to at least one cavity sidewall so that said free end portion is closer to one cavity sidewall than said opposite sidewall, said free end portion and said one cavity sidewall cooperating to biasingly receive therebetween a lead from an electronic package.

6. An electrical socket for receiving leads extending outwardly from an electronic package, comprising:
    a dielectric base housing having a top surface and a plurality of elongated cavities opening onto said top surface, said cavities having first and second oppositing sidewalls;
    a cover adapted to rest on and be moved across said top surface and having a plurality of openings therethrough which are in registration with at least a part of respective said elongated cavities; and
    a plurality of conductive contact elements disposed in said cavities and having a retention section and intermediate section which extend from a lower part of respective cavities towards said openings, and a cantilever beam which extends from said intermediate section along the length of respective cavities adjacent said openings, said cantilever beam having a free end portion cooperating with a cavity sidewall to compressingly engage therebetween a lead from an electronic package.

* * * * *

UNITED STATES PATENT OFFICE
CERTIFICATE OF CORRECTION

Patent No. 4,988,310      Dated January 29, 1991

Inventor(s) Edward J. Bright and James A. Hogan Jr.

It is certified that error appears in the above-identified patent and that said Letters Patent is hereby corrected as shown below:

Claim 1, Column 6, Line 5 - The words "sot hat" should be --so that--.

Claim 5, Column 6, Line 25 - The word "into" should be --onto--.

On the title page, in the Abstract:

Line 12 - The number "516" should be --156--.

Signed and Sealed this

Twenty-eighth Day of July, 1992

*Attest:*

DOUGLAS B. COMER

*Attesting Officer*     *Acting Commissioner of Patents and Trademarks*